United States Patent
Lane (10) Patent No.: US 6,868,128 B1
(45) Date of Patent: Mar. 15, 2005

(54) METHOD AND APPARATUS FOR CALIBRATING DC-OFFSETS IN A DIRECT CONVERSION RECEIVER

(75) Inventor: Mark V. Lane, San Diego, CA (US)

(73) Assignee: RFMD WPAN, Inc., San Diego, CA (US)

(*) Notice: Subject to any disclaimer, the term of this patent is extended or adjusted under 35 U.S.C. 154(b) by 749 days.

(21) Appl. No.: 09/610,555

(22) Filed: Jul. 5, 2000

(51) Int. Cl.$^7$ .............................................. H04L 25/06
(52) U.S. Cl. ...................................... 375/319; 455/324
(58) Field of Search ................................ 375/296, 316, 375/324, 322, 319, 143, 345, 219; 370/442; 455/324, 216, 266, 196.1, 278.1, 207, 232.1

(56) References Cited

U.S. PATENT DOCUMENTS

| | | | |
|---|---|---|---|
| 4,736,390 A | * 4/1988 | Ward et al. ................. | 375/316 |
| 4,944,025 A |   7/1990 | Gehring et al. ............. | 455/207 |
| 4,955,039 A |   9/1990 | Rother et al. ................ | 375/75 |
| 5,241,702 A |   8/1993 | Dent ......................... | 455/278.1 |
| 5,323,425 A |   6/1994 | Colamonico et al. ......... | 375/98 |
| 5,422,889 A | * 6/1995 | Sevenhans et al. .......... | 370/442 |
| 5,828,955 A | * 10/1998 | Lipowski et al. ............ | 455/324 |
| 6,240,100 B1 | * 5/2001 | Riordan et al. .............. | 370/442 |
| 6,298,096 B1 | * 10/2001 | Burgin ...................... | 375/296 |

* cited by examiner

*Primary Examiner*—Stephen Chin
*Assistant Examiner*—Ted Wang
(74) *Attorney, Agent, or Firm*—Withrow & Terranova, PLLC (57) ABSTRACT

A novel method and apparatus for calibrating DC offsets in a direct conversion receiver. The present DC offset calibration method and apparatus comprises a direct conversion receiver equipped with a frequency shifter means and a DC offset measurement and correction technique. In accordance with the present invention, DC offsets are calibrated in direct conversion receivers through an inventive method including two steps: a DC offset measurement step and a DC offset correction step. In the DC offset measurement step the frequency of a local oscillation signal (typically generated by a voltage-controlled oscillator (VCO)) is shifted by a selected frequency shift value during the inactive time intervals of the receiver. DC offsets are measured while the frequency of the down-conversion oscillation signal is shifted by the frequency shift value. Before the inactive time interval expires, the frequency of the down-conversion oscillator signal is shifted back to its original value. In the DC offset correction step of the present invention incoming signals are corrected using a correction means that removes the DC offset measured during the DC offset measurement step.

22 Claims, 4 Drawing Sheets

METHOD AND APPARATUS FOR CALIBRATING DC-OFFSETS IN A DIRECT CONVERSION RECEIVER

BACKGROUND OF THE INVENTION

1. Field of the Invention

This invention relates to direct conversion receivers, and more particularly to a method and apparatus for calibrating DC offsets in a direct conversion receiver.

2. Description of Related Art

As our society becomes more mobile, wireless communication devices become increasingly small. Reducing component size within portable wireless communication devices such as cellular phones, pagers and wireless personal digital assistants (PDAs) is increasingly desirable. Reducing radio receiver size provides a significant reduction in wireless communication device size. One exemplary radio receiver is a "direct conversion" receiver. Direct conversion receivers are also known as "zero intermediate frequency" (zero IF) receivers. Direct conversion receivers are well known in the wireless communication art. Direct conversion receivers are described in many prior art publications such as U.S. Pat. No. 4,944,025, issued on Jul. 24, 1990 to Gehring et al., U.S. Pat. No. 4,736,390, issued on Apr. 5, 1988 to Ward et al., U.S. Pat. No. 4,955,039, issued on Sep. 4, 1990 to Rother et al., U.S. Pat. No. 5,241,702, issued on Aug. 31, 1993 to Dent and U.S. Pat. No. 5,323,425, issued on Jun. 21, 1994 to Colamonico et al., which are all hereby incorporated by reference herein for their teachings on direct conversion receivers.

Direct conversion receivers are smaller in size than are typical radio receivers because direct conversion receivers require less tuned circuitry than do the other receiver designs. Typical radio receivers convert incoming signals to intermediate frequencies (IF) in an interim conversion prior to demodulation. In contrast, direct conversion receivers convert incoming signals directly into baseband signals in a single operation, thus eliminating the interim conversion step required by other types of receivers. Advantageously, direct conversion to baseband reduces the amount of tuned circuitry (e.g., it allows for the elimination of IF circuitry) typically required in radio receivers. A reduction in tuned circuitry allows a larger portion of the radio receiver to be integrated, and thus reduces the overall size of the radio receiver.

Figure 1:
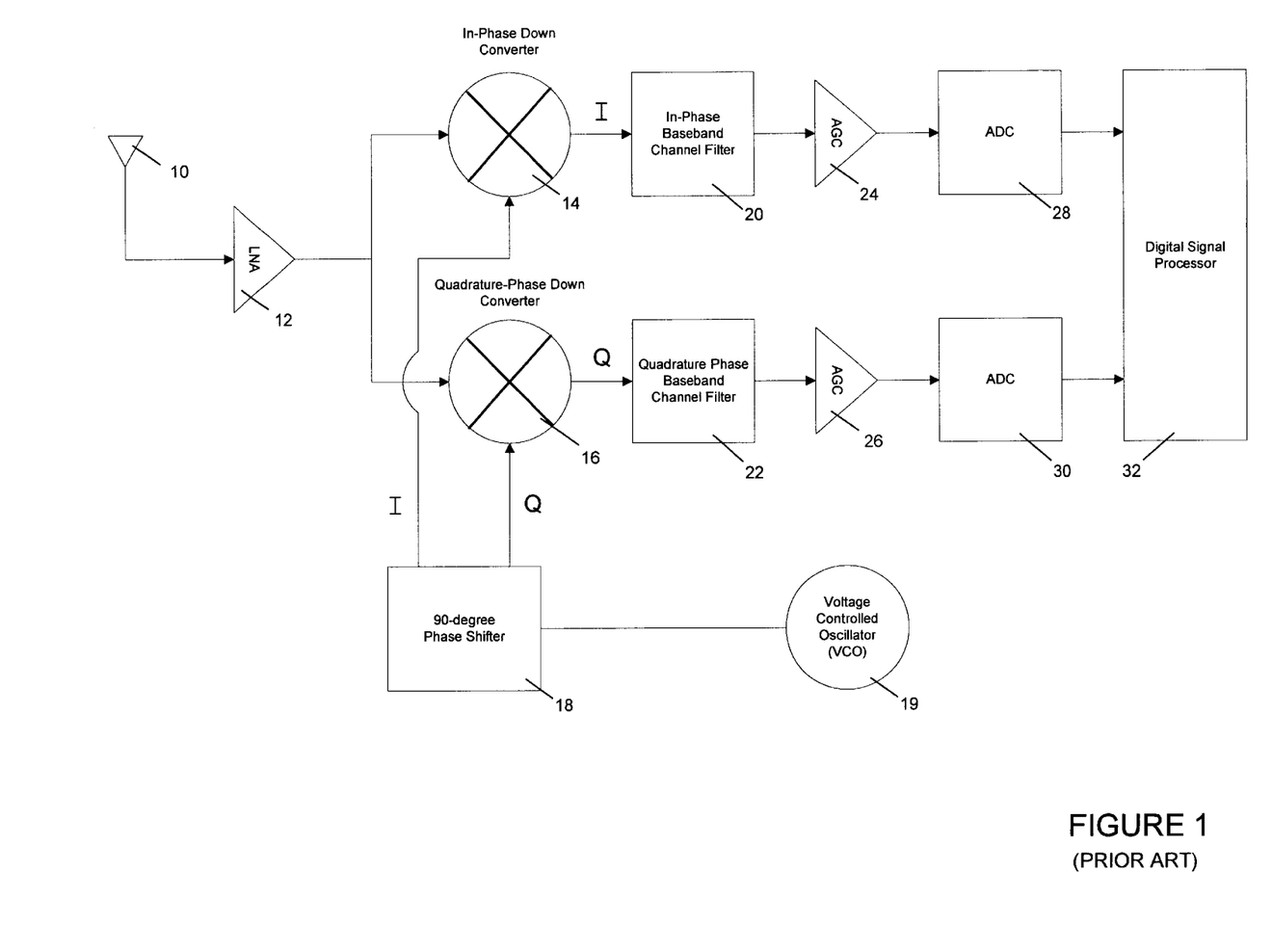
FIG. 1 is a block diagram of a typical direct conversion receiver.

FIG. 1 shows a block diagram of a typical direct conversion receiver. As shown in FIG. 1, an antenna 10 is coupled to a low-noise amplifier (LNA) 12. The antenna 10 receives incoming radio frequency signals and outputs the signals to the LNA 12. An incoming signal typically comprises a modulation signal and a carrier signal. The LNA 12 amplifies the signal from the antenna 10. The output of the LNA 12 is coupled to the inputs of the In-phase (I) down converter 14 and the Quadrature-phase (Q) down converter 16. The converters 14, 16 split the signal from the antenna 10 in a well-known manner that generates an "in-phase" or I-channel signal, and a "quadrature" or Q-channel signal and down converts the input radio frequency to baseband. The incoming signals are thereby separated or split into the I-channel and Q-channel or more simply "I" and "Q" signals. These split signals follow two separate signal processing paths as shown in FIG. 1. Separate signal processing paths are utilized to determine the polarity of the modulation signal. Determining signal polarity in a direct conversion receiver by using two substantially similar signal processing paths is well known in the art and thus is not described in more detail herein.

As shown in FIG. 1, the local oscillator used by direct conversion receivers is typically implemented by a voltage-controlled oscillator (VCO) 19. The VCO 19 outputs a local oscillation signal to the input of a 90-degree phase shifter 18. The phase shifter 18 splits the local oscillation signal into In-phase (I) and Quadrature-phase (Q) local oscillator signals in a well-known manner. The phase shifter 18 outputs the I and Q local oscillator signals to the inputs of the I and Q down converters 14, 16, respectively. The I and Q down converters 14, 16 mix the I and Q local oscillator signals to generate baseband "in-phase" and "quadrature" output signals.

The I and Q down converters 14, 16 output down-converted baseband signals to respective I and Q baseband channel filters (i.e., In-Phase baseband filter 20, and Quadrature baseband filter 22). The I and Q baseband channel filters 20, 22, respectively, filter the I and Q baseband signals and output filtered I and Q baseband signals to respective automatic gain control (AGC) amplifiers 24, 26.

The AGC amplifiers 24, 26 preserve the linearity of the filtered I and Q baseband signals, and thereby aid in accurately recovering the modulation signal. The AGC amplifiers 24, 26 output the processed baseband signals to respective I and Q analog-to-digital converters (ADC) 28, 30. The ADCs 28, 30 convert the analog processed baseband signals to digital baseband signals. The I and Q digital baseband signals are output from the ADCs 28, 30 and provided as inputs to a digital signal processor (DSP) 32. The DSP 32 analyzes the digital I and Q baseband signals and recovers the modulation signal therefrom in a well-known manner. Due to their design, as described above, direct conversion receivers advantageously reduce the amount of tuned circuitry required to implement radio receivers. However, direct conversion receivers disadvantageously produce unwanted side effects.

Disadvantageously, as is well known, receivers are particularly prone to signal interference caused by DC offsets (i.e., standing voltages). Direct conversion receivers are prone to this type of interference because the local oscillation signal (e.g., the signal generated by the VCO 19 and provided as input to the I and Q mixers 14, 16 through the 90-degree phase shifter 18) is typically operating at approximately the same frequency as the incoming signal (i.e., the signal received by the antenna 10). Therefore, self-mixing of the local oscillator (i.e., the VCO 19) and the In-Phase and Quadrature mixers (i.e., the mixers 14, 16, respectively) produces DC offsets. Unless these DC offsets are removed from any DC-coupled baseband signal, they will appear as interference in the received signal.

The self-mixing term is highly dependent on the amount of leakage/radiation generated by the local oscillator and injected into the front-end of the receiver. Referring to FIG. 1, DC offsets are produced from several sources within the direct conversion receiver. For example, DC offsets can be caused due to imperfections in the I and Q down converters 14, 16 and due to leakage from the VCO 19 back to the antenna 10. In fact, the largest source of DC offsets is due to leakage from the VCO 19 back to the antenna 10. DC offsets often cause the AGC amplifiers 24, 26 to saturate, and thus produce degradation or total loss of the incoming signals. The self-mixing term can be much larger than the received signal. Therefore, unless removed, the DC offset will completely dominate the incoming signal. This is especially true if the incoming signal is relatively weak in comparison. One obvious approach is to design the receiver so that the local oscillator leakage and radiation levels are reduced to minimum discernable signals. However, in practice, this proves to be difficult to achieve. Alternatively, direct conversion receivers can correct for DC offsets using DC offset calibration techniques.

Some prior art methods for calibrating DC offsets in direct conversion receivers comprise measuring the DC offsets and adjusting incoming signals accordingly. Two difficulties are encountered when attempting to measure and calibrate DC offsets in direct conversion receivers. First, any disturbances introduced by the process of measuring the DC offsets will change the DC offsets that are measured thereby, and will consequently not be removed by the calibration process. Second, during the measurement phase, the desired incoming signal should not be present. Otherwise, energy generated by the desired incoming signal will be added to the measured DC offset, and will subsequently be erroneously removed thereby introducing errors into the received signal.

Therefore, any DC offset calibration method has two major goals associated therewith: (1) the reduction or minimization of disturbances that can change the DC offset during the measurement phase; and (2) the measurement of DC offsets without the presence of the desired incoming signal during the time of measurement. Such methods should take advantage of the observation that receivers in some wireless communication systems such as Time-Division Duplexing (TDD) and Time-Division Multiple Access (TDMA) systems are only periodically active (i.e., actively receiving signals). Time intervals in such receivers can be classified as either "active" or "inactive". During active time intervals the receiver receives incoming signals. During inactive time intervals the receiver does not receive incoming signals and is therefore free to perform functions that are unrelated to receiving or processing the received signals, such as maintenance, system checks, and DC offset calibration.

One method for calibrating DC offsets in a direct conversion receiver measures DC offsets during inactive time intervals and adjusts the incoming signals accordingly. Referring to FIG. 1, the method begins calibration during inactive time intervals by first isolating the antenna 10 from the rest of the receiver. Isolation can be accomplished using switches that operate by switching the antenna 10 off. After switching the antenna 10 off, the method measures the DC offset in the receiver. Before the inactive time interval expires the antenna 10 is switched on to allow the receiver to once again actively receive incoming RF signals. Ideally, the DC offset is accurately measured and the method subtracts the DC offset from the incoming signals during active time intervals. However, disadvantageously, the method does not always produce ideal results.

For example, due to the isolation of the antenna, the method tends to disturb the DC offset measurement during the DC measurement interval and consequently inaccurately measures the DC offsets. In addition, due to inherent system timing uncertainties (and exacerbated by the goal of performing calibration measurements as close in time as possible to the beginning of the TDD or TDMA active time intervals), the method disadvantageously may measure DC offsets when a desired signal (e.g., a carrier wave or a modulated wave) is present. If the measured DC offset includes a desired signal (i.e., a carrier or modulated wave) the subtraction phase (i.e., the phase when the measured DC offset is subtracted from the received incoming signals during active time intervals) will disadvantageously remove a large portion of the desired signal together with the DC offset.

Therefore, a need exists for a method and apparatus for calibrating DC offsets in a direct conversion receiver. The method and apparatus should accurately measure DC offsets by reducing disturbances that change DC offsets during the measurement intervals. Such a method and apparatus should accurately measure DC offsets even in the presence of incoming signals. The method and apparatus should isolate the receiver from incoming signals during the time that DC offsets are measured. This isolation should be accomplished without switching the antenna off during the DC offset measurement phase. The present invention provides such a DC offset calibration method and apparatus.

SUMMARY OF THE INVENTION

The present invention is a novel method and apparatus for calibrating DC offsets in a direct conversion receiver. The present DC offset calibration method and apparatus uses a frequency shifter means to non-intrusively measure and correct for DC offsets in direct conversion receivers. Using the techniques taught by the present invention, the size of receivers used in wireless communication devices can be advantageously reduced.

The preferred embodiment of the present invention includes a frequency shifter that is coupled to a local voltage-controlled oscillator (VCO). The frequency shifter provides a means for shifting the frequency of a local oscillation signal used in direct conversion receivers. In an alternative embodiment, a modulation index and a modulation frequency are used to produce a desired shift in frequency in the local oscillation signal used in the direct conversion receivers.

In accordance with the present invention, DC offsets are calibrated in direct conversion receivers using a novel method involving two steps: a local DC offset measurement step and a DC offset correction step. In the DC offset measurement step, the frequency of a local oscillation signal generated by the voltage-controlled oscillator is shifted by a predetermined shifted value during inactive time intervals of the device. In the preferred embodiment, the frequency shift value is 500 kHz. The DC offset is measured while the frequency of the local oscillation signal is shifted. Before the inactive time interval expires, the frequency of the local oscillation signal is shifted back to its original frequency.

In the DC offset correction step of the present invention, incoming signals are corrected through a correction means that removes the measured DC offset. In the preferred embodiment of the present invention, the correction means comprises a subtraction means for subtracting the measured DC offset from incoming signals.

BRIEF DESCRIPTION OF THE DRAWINGS

Like reference numbers and designations in the various drawings indicate like elements.

DETAILED DESCRIPTION OF THE INVENTION

Throughout this description, the preferred embodiment and examples shown should be considered as exemplars, rather than as limitations on the present invention.

The preferred embodiment of the present invention is a method and apparatus for calibrating DC offsets in a direct conversion receiver. Direct conversion receivers facilitate reduced receiver sizes in wireless communication devices. However, as described above, these receivers produce DC offsets. DC offsets can cause a degradation or total loss of the incoming signals. Thus, it is desirable to measure and calibrate DC offsets in direct conversion receivers.

Referring again to FIG. 1, and as described above, direct conversion receivers split incoming signals, into In-Phase (I) and Quadrature Phase (Q) channel signals. The split I and Q channel signals follow two different signal-processing paths. As shown in FIG. 1, a first signal-processing path (the I-channel signal-processing path) includes the I down converter 14, the I-channel baseband channel filter 20, the AGC 24, the ADC 28, and the digital signal processor 32. The second signal-processing path (the Q-channel signal-processing path) includes the Q down converter 16, the Q-channel baseband channel filter 22, the AGC 26, the ADC 30 and the digital signal processor 32. The VCO 19 outputs a local oscillation signal (also referred to as a direct down-conversion oscillator signal) to the I and Q down converters 14, 16 through the 90-degree phase shifter 18.

The I and Q down converters 14, 16 mix the incoming signals with the local oscillator signal. Thus, the incoming signals are directly converted to I and Q baseband signals by the mixers 14, 16. The signal-processing paths. further process the baseband signals by filtering the I and Q signals (via the baseband channel filters 20, 22), linearly amplifying the filtered signals (via the AGCs 24, 26) and digitizing the linearly amplified signals (via the ADCs 28,30). The digitized I and Q channel baseband signals are processed by the digital signal processor (DSP) 32 to recover information related to the incoming signals. As described above in the background of the invention section, DC offsets are caused by many sources within direct conversion receivers such as by imperfections in the I and Q down converter mixers 14, 16 and by leakage from the VCO 19 back-to the antenna 10.

The present invention calibrates and corrects for DC offsets in direct conversion receivers using a method involving two principal steps: a DC offset measurement step and a DC offset correction or calibration step. The preferred embodiment of the present invention calibrates DC offsets by shifting the frequency of the local oscillation signal (or the direct down-conversion oscillator signal) by a predetermined shifted value and then measuring the DC offset. Thus, the preferred embodiment of the present invention utilizes a direct conversion receiver equipped with a local oscillation signal frequency shifter means (such as the VCO modulator 40 of FIG. 2). However, use of a frequency shifter means is not meant to limit the scope of the present invention as one of ordinary skill in the art shall recognize that any means for shifting the frequency of the local oscillation signal can be used without departing from the spirit of the present invention. For example, the VCO control line of the local VCO can be directly controlled in order to modulate the frequency of the local oscillation signal generated by the VCO.

Figure 2:
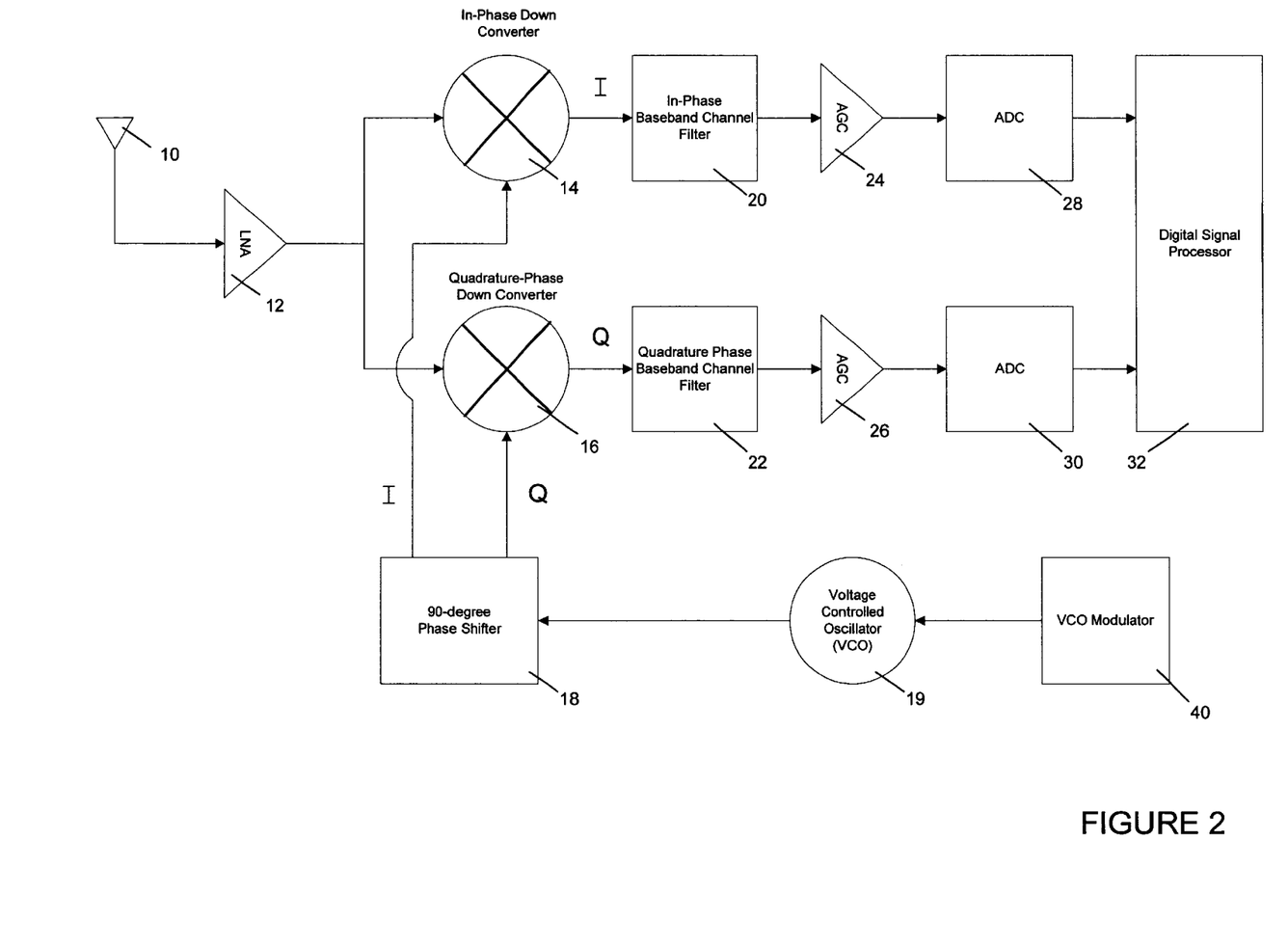
FIG. 2 is a block diagram of the preferred embodiment of a direct conversion receiver having DC offset calibration in accordance with the present invention.

FIG. 2 shows a block diagram of the preferred embodiment of a direct conversion receiver made in accordance with the present invention. The preferred embodiment of the present invention is similar to the direct conversion receiver described above with reference to FIG. 1. Similar components are not described in more detail below. As shown in FIG. 2, the antenna 10 is coupled to the LNA 12. The antenna 10 receives incoming RF signals and outputs the incoming signals to the input of the LNA 12. The LNA 12 amplifies the incoming signal from the antenna 10. The output of the LNA 12 is coupled to the inputs of the In-phase (I) down converter 14 and the Quadrature-phase (Q) down converter 16. The converters 14, 16 split the signal from the antenna 10 in a well-known manner that generates an "in-phase" or I-channel signal, and a "quadrature" or Q-channel signal and down converts the input radio frequency to baseband. The incoming signals are thereby separated or split into the I-channel and Q-channel or more simply "I" and "Q" signals. These split signals follow two separate signal processing paths (I and Q signal processing paths). The down converters 14, 16 mix the incoming signals with a down-conversion oscillator signal (i.e., a local oscillation signal) that is generated by the VCO 19 and the 90-degree phase shifter 18. In the embodiment shown in FIG. 2, the VCO 19 outputs the down-conversion oscillator signal to the I/Q direct down converters 14, 16 through the 90-degree phase shifter 18. The VCO modulator 40 controls the modulation of the VCO 19. The VCO modulator 40 is coupled to the input of the VCO 19. The VCO modulator 40 shifts the frequency of the down-conversion oscillator signal by a selected frequency shift value. The VCO 19 outputs the shifted frequency to the I and Q down converters 14, 16 through the 90-degree phase shifter 18.

In accordance with the present invention, during a DC offset measurement, the VCO modulator 40 is used to shift the frequency of the down-conversion oscillator signal to a desired pre-determined frequency. The DC offset measurement method comprises the following. First, the DC offset measurement method waits for the direct conversion receiver to enter into an inactive time interval. For example, in TDMA or TDD systems inactive time interval occur when the receiver is not designated to receive incoming signals. Second, the VCO modulator 40 shifts the frequency of the down-conversion oscillator signal by a predetermined frequency shift value. That is, the VCO modulator 40 changes the frequency of the down-conversion oscillator signal to a selected frequency. In the preferred embodiment, the frequency is shifted by 500 kHz (i.e., the frequency shift value is 500 kHz). However, this is not meant to be a limitation to the present invention as other frequency shift values can be used without departing from the spirit and scope of the present invention.

Third, the DC offset is measured at DC (i.e., at 0 Hz) during a time interval known as the DC measurement phase. The calibration is preferably initiated by the DSP 32 during the DC measurement phase. Voltage samples are taken from the ADCs 28, 30, for a pre-determined set of samples. The voltage samples are then averaged, and the average is used as the DC offset measurement. Once the DC measurement phase is complete, the DC offset measurement is used by the DSP 32 and the DC offset is subtracted from each sample generated by the DSP 32. In the preferred embodiment, the DC offset measurement comprises an average of 32 voltage samples of the ADCs 28, 30. However, this is not meant to be a limitation to the present invention as other means of measuring a voltage can be used without departing from the spirit and scope of the present invention. For example, a mode measurement calculated from 64 voltage samples can be used. Fourth, the VCO modulator 40 shifts the frequency of the down-conversion oscillator signal back to its original frequency. Thus, the original frequency of the down-conversion oscillator signal is restored.

The present invention modulates the local oscillator (i.e., the VCO 19) by shifting its output signal to a desired frequency value. The frequency of the local oscillator's output signal is shifted sufficiently so that any desired incoming signals (i.e., the I and Q signals output from mixers 14, 16, respectively) that are present during the DC offset measurement phase are effectively uncorrelated (or have vastly reduced correlation) with the local oscillator's output signal. As long as the local oscillator (i.e., VCO 19) is not shifted too far in frequency, the DC-offset term will not change. This is true because the local oscillator is always correlated to itself. In one embodiment of the present invention, the local oscillator should not be shifted in frequency to such a degree that it produces an equal to or greater than 10% change in the DC offset due to local oscillator leakage considerations. In one embodiment, the system operates at 2.4 GHz and thus, a shift of 500 kHz causes only a 0.02% change in the DC offset.

Using the inventive technique of the present invention, during the DC measurement phase of DC offset calibration, the receiver is effectively isolated from the incoming signal (i.e., the receiver is isolated from the antenna 10) without the need for additional switches. No switching is required to isolate the antenna, and hence, any input signals, from the receiver during the calibration phase of the DC offset removal process. Consequently, disturbances of the local oscillator leakage and radiation characteristics are advantageously minimal or non-existent.

Figure 3:
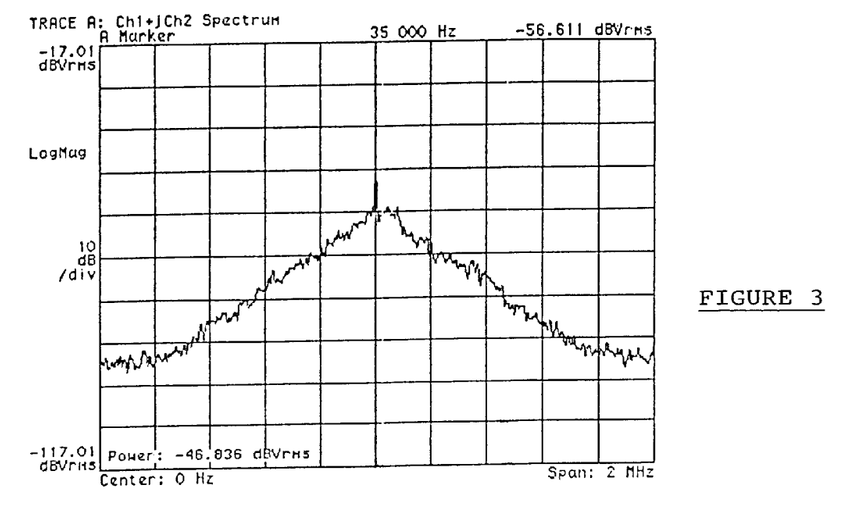
FIG. 3 shows a spectrum analyzer graph of a GFSK modulated signal centered at DC, at the baseband output of the direct conversion receiver of FIG. 2, wherein the receiver has a non-shifted local oscillation signal.

The DC offset of direct conversion receivers can be observed on a frequency spectrum analyzer graph. FIG. 3 shows a spectrum analyzer graph of a typical GFSK modulated baseband signal that is output by a direct conversion receiver having a non-shifted local oscillation signal. In FIG. 3 the GFSK modulated signal is output by the direct down converters 14, 16 without shifting the frequency of the down-conversion oscillation signal. As shown in FIG. 3, the baseband signal comprises both a desired baseband signal and a DC offset. The DC offset occurs at DC (i.e., at 0 Hz). Measuring the DC offset without shifting the down-conversion oscillation signal produces inaccuracies in the DC offset measurement because a large amount of the desired baseband signal is also measured. By shifting the frequency of the down-conversion oscillation signal most of the desired baseband signal energy is removed from the DC frequency during the DC offset measurement phase.

Figure 4:
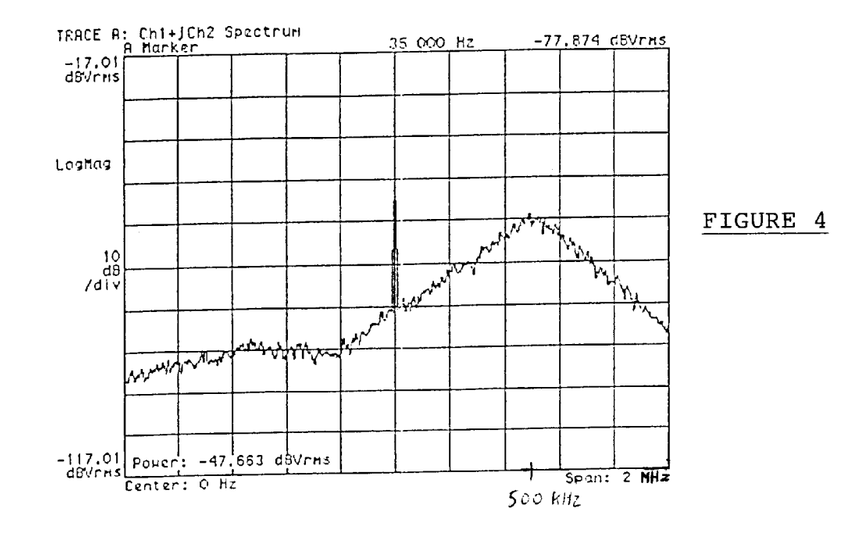
FIG. 4 shows a spectrum analyzer graph of a GFSK modulated signal centered at 500 kHz, at the baseband output of the direct conversion receiver of FIG. 2, wherein the receiver has a frequency-shifted local oscillation signal in accordance with the present invention.

In the preferred embodiment, the down-conversion oscillation signal is shifted by a frequency shift value of 500 kHz. FIG. 4 shows a spectrum analyzer graph of a GFSK modulated signal centered at 500 kHz, at the baseband output of the direct conversion receiver of FIG. 2, wherein the receiver uses a frequency-shifted down-conversion oscillation signal. In FIG. 4, the baseband signal output is produced from the down converters 14, 16 by shifting the down-conversion oscillator signal utilizing the VCO modulator 40. FIG. 4 shows a 500 kHz frequency shift of the down-conversion oscillation signal in accordance with the preferred embodiment of the present invention. As shown in FIG. 4, the baseband signal comprises both a shifted desired baseband signal and an unwanted DC offset. The DC offset occurring at DC (i.e., at 0 Hz) is more evident in FIG. 4 than it is in FIG. 3 because the desired incoming baseband signal is shifted in frequency. Because the incoming signal is frequency-shifted, only a small amount of the incoming signal is measured when measuring the DC offset. In fact in the preferred embodiment, the power in the frequency-shifted 250 kHz bandwidth is less than 20 dB in comparison to the total power of the modulated signal. Thus, the small amount of energy provided by the incoming signal that is measured during the DC offset measurement interval has little or no effect on the DC offset measurement. The DC offset measurement of the present invention is therefore much more accurate than are the prior art methods because the antenna is not turned off, and thus the DC offset is not disturbed during the measurement phase.

In the preferred embodiment, the DC offset is measured using the following steps. First, initialize the DC offset measurement to zero. Second, shift the local oscillator (i.e., the VCO 19) to an offset frequency. The offset frequency is preferably the channel frequency shifted by ½ the channel spacing for the system (i.e., 500 kHz). Third, wait for the local oscillator to produce the offset frequency. Fourth, sample 32 consecutive voltages from the ADC 28, 30. Fifth, average the value of the 32 voltage samples in the DSP. Sixth, store the average value as the DC offset measurement.

In the DC offset correction step of the present invention, incoming signals are corrected using a correction means that removes the measured DC offsets. In the preferred embodiment, the correction means is implemented using a subtraction means for subtracting the measured DC offset from the incoming signals. In the preferred embodiment, the subtraction means is implemented by the digital signal processor 32. However, the subtraction means is not meant to limit the present invention as one of ordinary skill in the art shall recognize that other methods of removing DC offsets from incoming signals can be used. For example, in an analog domain environment, a sampling capacitor circuit can be used to average the DC offset measured during the DC offset measurement phase.

In this embodiment, a sampling capacitor is used to store the DC offsets measured during the DC offset measurement phase. The sampling capacitor is allowed to charge during an "averaging" window. The capacitor averages the DC offsets by storing the DC offsets over a period of time. At the termination of the DC offset measurement phase, the charge on the sampling capacitor represents the DC offset that is to be removed from the incoming signals. After the DC offset measurement phase terminates, and during the DC offset removal phase, the DC offset voltage stored on the capacitor can be used as a reference voltage in an analog subtraction circuit. The analog subtraction circuit is used to remove the DC offset (represented by the reference voltage used by the analog subtraction circuit) from the incoming baseband signals before they are input to the ADCs 28, 30.

An alternative embodiment of the present invention takes advantage of the observation that a modulation index and a modulation frequency can be selected to produce the same frequency shifting effect as used in the preferred embodiment. For example, instead of shifting the local oscillator frequency, it is possible to apply modulations that effectively spread the energy of the local oscillator over a wide frequency range. As is well known, frequency modulating a carrier signal results in many frequency components that include the carrier signal and the appropriate Bessel components. The modulating frequency determines the spacing of the Bessel components and the modulation index determines the amplitude of the components. Thus, the carrier component can be reduced to a very small value by appropriately selecting a modulating frequency and a modulation index.

In fact, theoretically, a modulation index of 2.4, 5.5, 8.6, etc. will result in a carrier component of zero. However, as the modulation index becomes larger, the number of Bessel components with significant energy correspondingly becomes larger. Accordingly, a modulation index of 2.4 is preferably used because it produces a first carrier null with the least number of Bessel components having significant energy.

Thus, in an exemplary embodiment of the present invention, having a modulating frequency of 200 kHz and a deviation of 480 kHz, the energy in the local oscillator is spread away from the center frequency. When the frequency modulated local oscillator is mixed with the incoming frequency it produces a baseband signal with the same spreading as the local oscillator but which now has the modulated incoming signal superimposed thereon. The resulting signal is a baseband signal that has much less power within +/−125 kHz band of DC than it would have if the local oscillator were not modulated. Alternatively, instead of using a pure 200 kHz modulating frequency, a noise signal can be used and the modulation index can be increased to a very large number (e.g., >10). At very large modulation indices, the effect is analogous to taking the energy that was once centered at DC and spreading it over many MHz of frequency. The energy at DC is greatly attenuated as a result.

In summary, the preferred embodiment of the present invention is a method and apparatus for calibrating DC offsets in direct conversion receivers. The present DC offset calibration method and apparatus utilizes a combination of direct conversion receivers equipped with frequency-shifting means and a DC offset measurement and correction technique. Advantageously, the present invention facilitates the reduction in receiver size in wireless communication devices.

Figure 5:
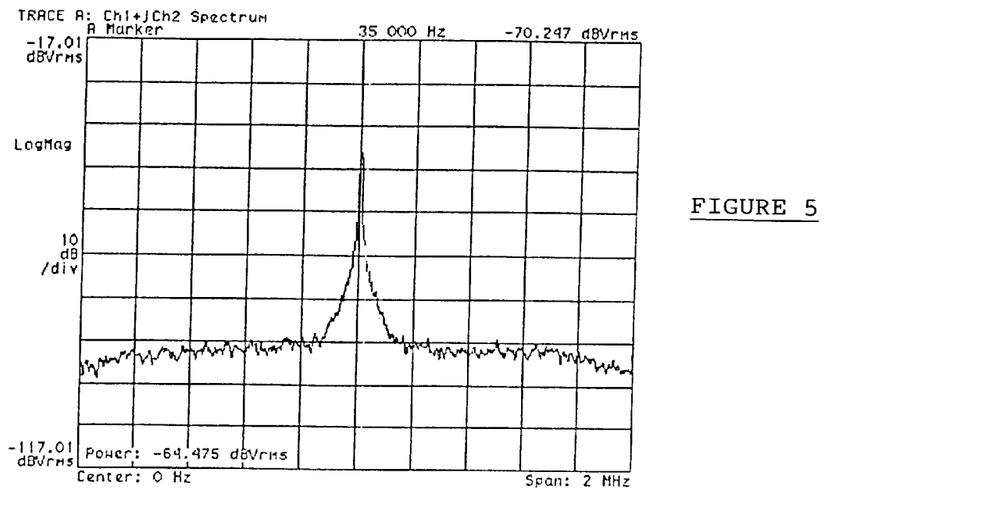
FIG. 5 shows a spectrum analyzer graph of a carrier signal output by the baseband output of a direct conversion receiver.
Figure 6:
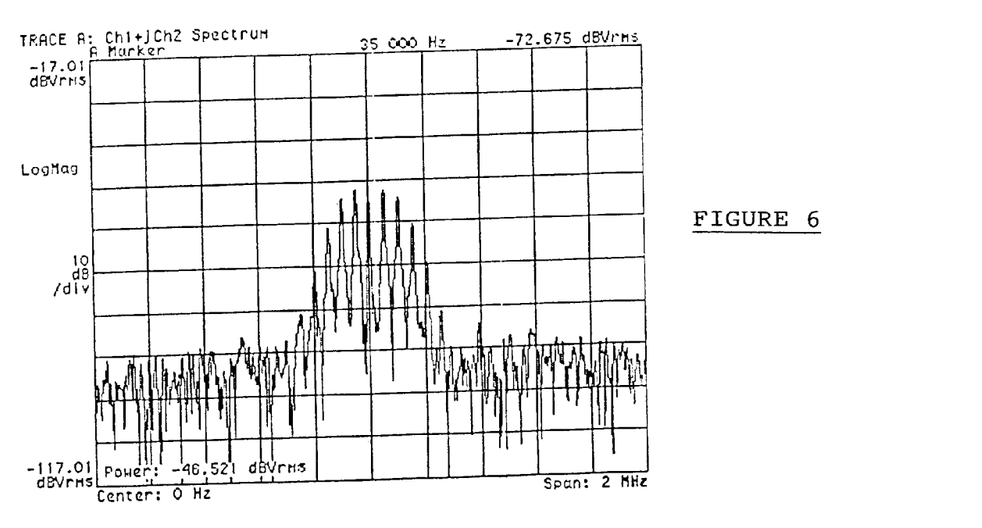
FIG. 6 shows the signal shown in FIG. 5, modulated with a 50 kHz tone signal to a modulation index of 2.4.

A few embodiments of the present invention have been described. Nevertheless, it will be understood that various modifications may be made without departing from the spirit and scope of the invention. For example, the present inventive method and apparatus can produce a shifted baseband signal using a VCO modulator. In another example, a modulation index and a modulation frequency can be used to produce a shifted baseband signal. Alternatively, the frequency of the local oscillation signal (or the "down-conversion oscillator signal") can be shifted by directly modulating the local oscillator (i.e., the VCO 19). In one embodiment, the down-conversion oscillator signal is modulated by directly controlling the control line of the VCO. By carefully selecting a frequency modulation index and modulation frequency, the DC offsets can be accurately measured and calibrated. FIGS. 5 and 6 show spectrum analyzer graphs of the effects of this approach.

FIG. 5 shows a graph of a carrier signal output by the baseband output of a direct conversion receiver. As shown in FIG. 5, the carrier signal at the baseband output is exactly at DC. However, by modulating the local oscillator of the direct conversion receiver during the DC offset calibration phase, the signal's energy is removed from DC and the only DC component remaining is that due to DC offsets. This effect is shown graphically in FIG. 6 wherein the signal is now modulated with a 50 kHz tone to a modulation index of 2.4. Alternatively as described above, modulation indices of 5.5, 8.6, etc. can be used to practice the present invention without departing from the scope of the present invention. Accordingly, it is to be understood that the invention is not to be limited by the specific illustrated embodiment, but only by the scope of the appended claims.

What is claimed is:

1. A method of calibrating DC offsets in a direct conversion receiver adapted to receive incoming signals wherein the incoming signals are split into In-phase and Quadrature phase signals, and wherein the direct conversion receiver includes an In-phase down converter having a first mixer input and a second mixer input, wherein the first mixer input is adapted to receive the In-phase signal, a Quadrature phase down converter having a first mixer input and a second mixer input, wherein the first mixer input is adapted to receive the Quadrature phase signal, and a local oscillator circuit capable of generating a local oscillation signal having a predetermined original frequency value, and wherein the local oscillation signal is coupled to the second mixer inputs of the In-phase and Quadrature phase down converters, the method comprising the steps of:

(a) detecting an inactive time interval during which the direct conversion receiver is not receiving incoming signals requiring processing;

(b) shifting the frequency of the local oscillation signal generated by the local oscillator circuit by a selected frequency shift value when an inactive time interval is detected in step (a), wherein the shifting of the frequency of the local oscillation signal effectively isolates the receiver from the incoming signals;

(c) measuring a DC offset in the signal generated by the direct conversion receiver;

(d) shifting the frequency of the local oscillation signal by the frequency shift value used in step (b), wherein the local oscillation signal is returned to its original frequency value;

(e) calibrating the direct conversion receiver for DC offsets by removing the DC offset measured in step (c) from the incoming signals; and (f) returning to step (a).

2. The method of calibrating DC offsets in a direct conversion receiver of claim 1, wherein an inactive time interval is defined in a time-division system as a time interval during which the receiver is not designated for receiving an incoming signal.

3. The method of calibrating DC offsets in a direct conversion receiver of claim 1, wherein the local oscillation signal is shifted in step (b) using a frequency shifter.

4. The method of calibrating DC offsets in a direct conversion receiver of claim 1, wherein the selected frequency shift value is 500 kHz.

5. The method of calibrating DC offsets in a direct conversion receiver of claim 1, wherein step (c) of measuring a DC offset further comprises:

i) initializing a DC offset measurement to zero;

ii) waiting for a pre-determined local oscillator settling time that is sufficient to allow the local oscillator to be shifted by the frequency shift value;

iii) obtaining at least one sample of a signal generated by the direct conversion receiver;

iv) determining the DC offset measurement based upon the at least one sample obtained in step (iii) of claim 5; and v) storing the DC offset measurement determined in step (iv).

6. The method of calibrating DC offsets in a direct conversion receiver as set forth in claim 5, wherein the direct conversion receiver operates within a wireless communication system, and wherein the communication system transmits and receives information using pre-determined radio frequency channels spaced apart from each other by a pre-determined channel spacing, and wherein the frequency shift value comprises ½ the channel spacing used by the communication system.

7. The method of calibrating DC offsets in a direct conversion receiver of claim 5, wherein the step (iii) of obtaining at least one sample comprises obtaining N samples of the signal generated by the direct conversion receiver, and wherein the DC offset measurement is determined in step (iv) by averaging the N samples obtained in step (iii).

8. The method of calibrating DC offsets in a direct conversion receiver of claim 7, wherein N is 32.

9. The method of calibrating DC offsets in a direct conversion receiver of claim 1, wherein the step (e) of calibrating the direct conversion receiver for DC offsets comprises subtracting the DC offset measured in step (c) from the incoming signal.

10. The method of calibrating DC offsets in a direct conversion receiver of claim 1, wherein the direct conversion receiver includes a sampling capacitor circuit and a DC removal circuit, including a capacitor adapted to receive a DC offset measurement voltage, and wherein the method further includes:
  g) resetting a charge on the sampling capacitor to zero;
  h) charging the capacitor during an averaging time interval of the receiver during which the DC offset measurement is averaged and determined by a voltage charge of the sampling capacitor;
  i) determining the occurrence of an active time interval of the receiver; and
  j) using the voltage charge stored on the sampling capacitor during step (h) as a reference voltage for a DC removal circuit, wherein the DC removal circuit is used during the active time interval to subtract the voltage charge stored on the capacitor from the incoming signals, thereby removing the DC offset measurement averaged during step (h).

11. An apparatus for calibrating DC offsets in a direct conversion receiver adapted to receive incoming signals wherein the incoming signals are split into In-phase and Quadrature phase signals, and wherein the direct conversion receiver includes an In-phase down converter having a first mixer input and a second mixer input, wherein the first mixer input is adapted to receive an In-phase signal, a Quadrature phase down converter having a first mixer input and a second mixer input, wherein the first mixer input is adapted to receive a Quadrature phase signal, and a local oscillator circuit capable of generating a local oscillation signal having a predetermined original frequency value, and wherein the local oscillation signal is coupled to the second mixer inputs of the In-phase and Quadrature phase down converters, comprising:
  (a) an input pause detector for detecting the occurrence of an inactive time interval during which the direct conversion receiver is not receiving incoming signals requiring processing;
  (b) frequency shifting apparatus, coupled to the input pause detector, for shifting the frequency of the local oscillation signal generated by the local oscillator circuit by a selected frequency shift value, wherein the shifting of the frequency of the local oscillation signal effectively isolates the receiver from the incoming signals;
  (c) voltage measuring apparatus, coupled to the input pause detector and frequency shifting apparatus, for measuring a DC offset in the signal generated by the direct conversion receiver; and
  (d) an offset calibrator, coupled to the voltage measuring apparatus, for calibrating the direct conversion receiver for DC offsets by removing the DC offset measured by the measuring means from the incoming signals.

12. The apparatus for calibrating DC offsets of claim 11, wherein the frequency shifting apparatus comprises a VCO modulator.

13. The apparatus for calibrating DC offsets of claim 11, wherein the frequency shifting apparatus uses a selected modulation index and a selected modulation frequency to shift the frequency of the local oscillation signal by the selected frequency shift value.

14. The apparatus for calibrating DC offsets of claim 11, wherein the voltage measuring apparatus comprises a digital signal processor adapted to receive filtered and linearly amplified versions of the In-phase and Quadrature phase signals.

15. The apparatus for calibrating DC offsets of claim 11, wherein the offset calibrator comprises an offset subtractor for subtracting the measured DC offsets from the incoming signals.

16. The apparatus for calibrating DC offsets of claim 15, wherein the offset subtractor comprises a digital signal processor.

17. The apparatus for calibrating DC offsets of claim 15, further comprising:
  (a) an In-phase (I) baseband channel filter having an input coupled to an output of the In-phase down converter, and a Quadrature phase (Q) baseband channel filter having an input coupled to an output of the Quadrature phase down converter, wherein the In-phase down converter outputs an In-phase (I) baseband signal and the Quadrature phase down converter outputs a Quadrature phase (Q) baseband signal, and wherein the baseband channel filters filter the I and Q baseband signals to generate respective and associated filtered I and Q baseband signals;
  (b) two automatic gain control (AGC) amplifiers, a first AGC amplifier having inputs adapted to receive the filtered I baseband signal, a second AGC amplifier having inputs adapted to receive the filtered Q baseband signal, wherein the AGC amplifiers linearly amplify the filtered I and Q baseband signals and provide amplified analog I and Q baseband signals at respective and associated AGC outputs;
  (c) two analog-to-digital converters (ADCs) coupled to a respective and associated AGC amplifier output, wherein the ADCs convert the analog I and Q baseband signals to digital baseband signals and provide the digital baseband signals at respective and associated ADC outputs; and
  (d) a digital signal processor (DSP) having inputs coupled to the ADC outputs, wherein the DSP analyzes the digital baseband signals and removes the measured DC offsets from the digital baseband signals.

18. The apparatus for calibrating DC offsets of claim 11, wherein the local oscillator circuit comprises a voltage-controlled oscillator.

19. The apparatus for calibrating DC offsets of claim 18, wherein the frequency of the local oscillation signal is shifted by the selected frequency shift value by controlling a control input of the voltage-controlled oscillator.

20. The apparatus for calibrating DC offsets of claim 11, wherein the selected frequency shift value is 500 kHz.

21. The apparatus for calibrating DC offsets of claim 11, wherein the incoming signals are down-converted into Gaussian frequency shift keyed (GFSK) modulated baseband signals.

22. An apparatus for calibrating DC offsets in a direct conversion receiver, wherein an incoming signal is split into two signal processing paths, wherein a first signal processing path comprises an In-phase (I) signal processing path and a second signal processing path comprises a Quadrature phase (Q) signal processing path, and wherein each path includes a respective direct down converter coupled to a signal processor, and wherein the down converters each have an input coupled to a local oscillator circuit, and wherein the local oscillator circuit comprises a frequency shifter means, a local oscillator, and an oscillator modulator, comprising:

(a) means for detecting the occurrence of an inactive time interval;

(b) means, coupled to the detecting means, for shifting a signal of the local oscillator by a predetermined frequency shift value, wherein shifting the signal of the local oscillator by the predetermined frequency shift value effectively isolates the receiver from the incoming signal;

(c) means, coupled to the detecting and the shifting means, for measuring a DC offset in the I and Q signal processing paths; and (d) means, coupled to the measuring means, for calibrating the direct conversion receiver for DC offsets by removing the DC offset measured by the measuring means from the incoming signal.

* * * * *